(12) United States Patent
Li

(10) Patent No.: US 7,362,039 B2
(45) Date of Patent: Apr. 22, 2008

(54) PIEZOELECTRIC ELEMENT, METHOD OF MANUFACTURING THE SAME, LIQUID-JET HEAD, METHOD OF MANUFACTURING THE SAME, AND LIQUID-JET APPARATUS

(75) Inventor: Xin-Shan Li, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/384,324

(22) Filed: Mar. 21, 2006

(65) Prior Publication Data

US 2006/0244789 A1  Nov. 2, 2006

(30) Foreign Application Priority Data

Mar. 22, 2005 (JP) ............................. 2005-081729
Dec. 13, 2005 (JP) ............................. 2005-359118

(51) Int. Cl.
  *H01L 41/187* (2006.01)
  *H01L 41/09* (2006.01)
(52) U.S. Cl. ...................................... 310/358
(58) Field of Classification Search ................. 310/358
   See application file for complete search history.

(56) References Cited

U.S. PATENT DOCUMENTS

| 4,397,886 | A | * | 8/1983 | Neirman et al. ............ 427/80 |
| 5,112,433 | A | * | 5/1992 | Dawson et al. ........... 423/593.1 |
| 5,219,811 | A | * | 6/1993 | Enomoto et al. ............ 501/138 |
| 5,512,796 | A | * | 4/1996 | Paton ........................ 310/358 |
| 5,969,935 | A | * | 10/1999 | Kammerdiner et al. ..... 361/311 |
| 6,258,291 | B1 | | 7/2001 | Kimura et al. |
| 6,398,349 | B1 | | 6/2002 | Murai |
| 6,571,446 | B2 | | 6/2003 | Qiu et al. |

(Continued)

FOREIGN PATENT DOCUMENTS

EP  0 780 913 B1  7/1999

(Continued)

OTHER PUBLICATIONS

Matthes B. et al. "Production of Dense Lead Zirconate Titanate (PZT) Films", Key Engineering Material , Aerdermannsdorf, CH, , Part 2, (1997) vol. 132/136 pp. 1139-1142.

(Continued)

*Primary Examiner*—Thomas M. Dougherty
(74) *Attorney, Agent, or Firm*—Sughrue Mion, PLLC

(57) ABSTRACT

Disclosed are a piezoelectric element, which has a high withstand voltage and a longer durability life, a manufacturing method of the piezoelectric element, a liquid-jet head, a manufacturing method of the liquid-jet head, and a liquid-jet apparatus. The manufacturing method of a piezoelectric element includes the steps of: forming a piezoelectric layer by forming, on the lower electrode, a piezoelectric precursor film in which Pb, Zr and Ti are contained and the composition ratio of Pb, Zr and Ti becomes Pb/(Zr+Ti)=1.0 to 1.3 after the piezoelectric precursor film has been baked, and to which at least any one dopant selected from the group consisting of manganese, nickel and strontium is doped, and by then baking the piezoelectric. precursor film for half an hour to three hours at 650 to 750° C.; and forming an upper electrode on the piezoelectric layer.

7 Claims, 8 Drawing Sheets

U.S. PATENT DOCUMENTS

| | | | |
|---|---|---|---|
| 7,033,001 | B2 | 4/2006 | Fujii et al. |
| 7,132,057 | B2 * | 11/2006 | Liufu .................. 252/62.9 PZ |
| 2001/0016229 | A1 * | 8/2001 | Sun et al. ................ 427/376.2 |
| 2004/0129917 | A1 | 7/2004 | Kubota et al. |
| 2004/0129918 | A1 | 7/2004 | Eritate et al. |
| 2004/0132221 | A1 | 7/2004 | Kobayashi et al. |

FOREIGN PATENT DOCUMENTS

| | | | |
|---|---|---|---|
| JP | 9-232644 | A | 9/1997 |
| JP | 2001-113705 | A | 4/2001 |
| JP | 2001-284670 | A | 10/2001 |
| JP | 2001-302348 | A | 10/2001 |
| JP | 2001-302349 | A | 10/2001 |
| JP | 2001-302350 | A | 10/2001 |
| JP | 2002-226266 | A | 8/2002 |
| JP | 2004-107181 | A | 4/2004 |
| JP | 2004-235553 | A | 8/2004 |
| JP | 2005-082424 | A | 3/2005 |
| KR | 2000-71300 | A | 11/2000 |
| KR | 2003-85538 | A | 11/2003 |

OTHER PUBLICATIONS

Tae Song Kim et al., "Structural and Electrical Properties of Excess PbO doped $Pb(Zr_{0.52}Ti_{0.48})O_{3\ t}$ thin films using rf magnetron sputtering method", Journal of Materials Research, Dec. 1998, vol. 13, No. 12, pp. 3436-3441, XP009068586.

Tuttle, B.A. et al. "Characterization chemically prepared PZT thin films", Ferroelectric Thin Films Symposium Mater, 1990, p. 165, line 14-line 24, XP009068637.

Fei Xu et al. "Properties of the Sol-Gel Derived Lead Zirconate Titanate (PZT) Thin Films on Platinum-coated Silicon Substrates", ISAF 96. Proceedings of the Tenth IEEE International Symposium on Applications of Ferroelectrics (Cat. No. 96CH35948) IEEE, 1996, vol. 1 pp. 511-514, New York, NY.

Dimos D. et al., Control of Leakage Resistance in Pb(Zr, Ti)O3 Thin Films by Donor Doping, Journal of the American Ceramic Society. Nov. 1994, pp. 3000-3005, vol. 77, Blackwell Publishing, Malden. MA.

Gardeniers JGE et al., Direct Measurement of Piezoelectric Properties of Sol-Gel PZT films; Feb. 1998, p. S1573-S1577, vol. 32, Journal of the Korean Physical Society Korean Phys. Soc South Korea.

Bang-Hung Tsao et al., "Lead Zirconate Titanate (PZT) film Capacitor with a Multilayer Construction", Proceedings of the IEEE 1998 National Aerospace and Electronics Conference., 1998, pp. 263-270, New York, NY.

* cited by examiner

PIEZOELECTRIC ELEMENT, METHOD OF MANUFACTURING THE SAME, LIQUID-JET HEAD, METHOD OF MANUFACTURING THE SAME, AND LIQUID-JET APPARATUS

The entire disclosure of Japanese Patent Application Nos. 2005-081729 filed Mar. 22, 2005 and 2005-359118 filed Dec. 13, 2005 are expressly incorporated by reference herein.

BACKGROUND OF THE INVENTION

1. Field of the Invention

The present invention relates to a piezoelectric element including a lower electrode, a piezoelectric layer and an upper electrode as well as a method of manufacturing the piezoelectric element. Specifically, the present invention relates to a liquid-jet head which ejects droplets from nozzle orifices, and a method of manufacturing the liquid-jet head as well as a piezoelectric element used for a liquid-jet apparatus.

2. Description of the Prior Art

An inkjet recording head with the following configuration has been put into practical use. In accordance with the configuration, a part of pressure generating chambers communicating with nozzle orifices from which ink droplets are ejected is constructed with a vibration plate. The vibration plate is deformed by piezoelectric elements, and thus ink in each of the pressure generating chambers is pressurized. Accordingly, ink droplets are ejected from each of the nozzle orifices. An inkjet recording head which is constructed, for example, in the following manner is among such inkjet recording heads. An even layer made of a piezoelectric material is formed on the entire surface of the vibration plate by use of a film-forming technique. Then, this layer made of the piezoelectric material is cut into shapes corresponding to the pressure generating chambers by a lithography method. Thereby, the piezoelectric elements are formed respectively in the pressure generating chambers in order that the piezoelectric elements can be independent from one another.

A piezoelectric element including a piezoelectric layer with a withstand voltage, which is improved by means of suppressing a leakage current thereof, has been proposed as such a piezoelectric element used for such inkjet recording heads, the leakage current being suppressed by means of setting an amount of halogen material contained therein as a component of the piezoelectric layer. (See claims in pp. 11 of Japanese Patent Laid-open Official Gazette No. 2004-107181, for example)

However, according to Japanese Patent Laid-open Official Gazette No. 2004-107181, although the leakage current of the piezoelectric layer can be suppressed, an electric resistivity of the piezoelectric layer is not set. Accordingly, there has been a problem that the durability of the piezoelectric layer is deteriorated due to an increased leakage current if the electric resistivity is lower.

Note that, such problems are not limited to liquid-jet heads represented by inkjet recording heads as well as methods of manufacturing the liquid-jet heads. The problems are similarly present in other piezoelectric elements and methods of manufacturing the piezoelectric elements.

SUMMARY OF THE INVENTION

With the aforementioned conditions taken into consideration, an object of the present invention is to provide a piezoelectric element, which has a high withstand voltage and a longer durability life, a method of manufacturing the piezoelectric element, a liquid-jet head, a method of manufacturing the liquid-jet head, and a liquid-jet apparatus.

A first aspect of the present invention for the purpose of solving the aforementioned problems is a method of manufacturing a piezoelectric element characterized by including the steps of: forming a lower electrode on a substrate; forming a piezoelectric layer by forming on the lower electrode a piezoelectric precursor film in which Pb, Zr and Ti are contained and the composition ratio of Pb, Zr and Ti becomes Pb/(Zr+Ti)=1.0 to 1.3 after the piezoelectric precursor film has been baked, and to which at least any one dopant selected from the group consisting of manganese, nickel and strontium is doped, and by then baking the piezoelectric precursor film for half an hour to three hours at 650 to 750° C.; and forming an upper electrode on the piezoelectric layer.

In the first aspect, it is possible to form a piezoelectric element having good crystallinity and high stability by causing excessive lead to be contained in the piezoelectric layer and setting predetermined temperature and time for baking.

Additionally, by doping the predetermined dopant, it is possible to obtain a piezoelectric element with desired electric resistivity and a withstand voltage while extending the durability life thereof, whereby reliability thereof can be improved.

A second aspect of the present invention is the method according to the first aspect of the present invention, which is characterized in that an amount of the dopant is not more than 10 mol % of the piezoelectric layer.

In the second aspect, by setting a predetermined amount for the dopant, it is possible to prevent the displacement characteristics of the piezoelectric element from being deteriorated due to an excessive amount of the dopant.

A third aspect of the present invention is the method according to any of the first and second aspects, which is characterized in that in the step of forming the piezoelectric layer, the piezoelectric layer is formed by repeatedly performing a piezoelectric film forming step of forming piezoelectric films by baking a plurality of the piezoelectric precursor films, and a length of time for baking the piezoelectric film in each piezoelectric layer forming step is not less than half ah hour, and a total length of baking time for the piezoelectric layer is not more than three hours.

In the third aspect, it is possible to form a piezoelectric layer having a desired thickness with high precision, good crystallinity and high stability.

A fourth aspect of the present invention is a method of manufacturing a liquid-jet head, which is characterized in that the liquid-jet head is manufactured by use of the method according to any one of the first to third aspects.

In the fourth aspect, it is possible to obtain a liquid-jet head with an extended durability life and improved reliability. A fifth aspect of the present invention is a piezoelectric element including: a lower electrode provided above a substrate; a piezoelectric layer provided above the lower electrode; and an upper electrode provided above the piezoelectric layer, the piezoelectric layer being characterized in that the piezoelectric layer contains at least any one dopant selected from the group consisting of manganese, nickel and strontium, and in that electric resistivity of the piezoelectric layer is not lower than 20 MΩ·cm.

In the fifth aspect, by setting predetermined electric resistivity of the piezoelectric layer, it is possible to improve a withstand voltage thereof and extend a durability life thereof.

Additionally, by doping the predetermined dopant to a piezoelectric layer, it is possible to obtain the piezoelectric layer with desired electric resistivity and a desired withstand voltage and extend durability life thereof, whereby reliability thereof can be improved.

A sixth aspect of the present invention is the piezoelectric element according to the fifth aspect, which is characterized in that a withstand voltage of the piezoelectric layer is not lower than 900 kV/cm.

In the sixth aspect, by setting a predetermined withstand voltage of the piezoelectric layer, it is possible to extend the durability life thereof to improve the reliability thereof.

A seventh aspect of the present invention is the piezoelectric element according to any of the fifth and sixth aspects, which is characterized in that a leakage current of the piezoelectric layer is not larger than $1\times10^{-8}$ A/cm$^2$.

In the seventh aspect, by setting a predetermined leakage current of the piezoelectric layer, it is possible to extend the durability life thereof to improve the reliability thereof.

An eighth aspect of the present invention is the piezoelectric element according to any one of the fifth to seventh aspects, which is characterized in that a relative permittivity of the piezoelectric layer is 750 to 1500.

In the eighth aspect, the crystallinity of the piezoelectric layer is significantly improved. Accordingly, it is possible to provide the piezoelectric layer having excellent displacement characteristics, a high withstand voltage and longer durability life.

A ninth aspect of the present invention is the piezoelectric element according any one of the fifth to eighth aspects, which is characterized in that a coercive electric field and residual polarization intensity of the piezoelectric layer are respectively 15 to 30 kV/cm and 10 to 25 µC/cm$^2$.

In the ninth aspect, the crystallinity of the piezoelectric layer achieves a greater excellence, and the displacement characteristics and durability life thereof are further improved.

A tenth aspect of the present invention is a piezoelectric element characterized by including: a lower electrode provided above a substrate; a piezoelectric layer provided above the lower electrode; and an upper electrode provided above the piezoelectric layer, in which the piezoelectric layer contains at least any one dopant selected from the group consisting of manganese, nickel and strontium and electric resistivity of the piezoelectric layer is not lower than 20 MΩ·cm, the piezoelectric element being characterized in that a leakage current and a withstand voltage of the piezoelectric layer are respectively not larger than $1\times10^{-8}$ A/cm$^2$ and not lower than 900 kV/cm.

In the tenth aspect, by setting predetermined electric. resistivity, leakage current and withstand voltage of the piezoelectric layer, it is possible to extend durability life thereof to improve reliability thereof.

Additionally, by doping a predetermined dopant, it is possible to obtain a piezoelectric element with desired electric resistivity and withstand voltage while extending the durability life thereof, whereby reliability thereof can be improved.

An eleventh aspect of the present invention is a liquid-Jet head characterized by including: the piezoelectric element according to any one of claims 5 to 10; and a passage-forming substrate, to which the piezoelectric element is provided with a vibration plate interposed in between, and to which a pressure generating chamber communicating with a nozzle orifice is provided.

In the eleventh aspect, it is possible to obtain a liquid-jet head with improved durability life and reliability.

A twelfth aspect of the present invention is a liquid-jet apparatus characterized by including the liquid-jet head according to the eleventh aspect.

In the case of the twelfth aspect, it is possible to obtain a liquid-jet apparatus with improved durability life and reliability.

DESCRIPTION OF THE PREFERRED EMBODIMENTS

Hereinafter, detailed descriptions will be provided for the present invention on a basis of embodiments.

First Embodiment

Figure 1:
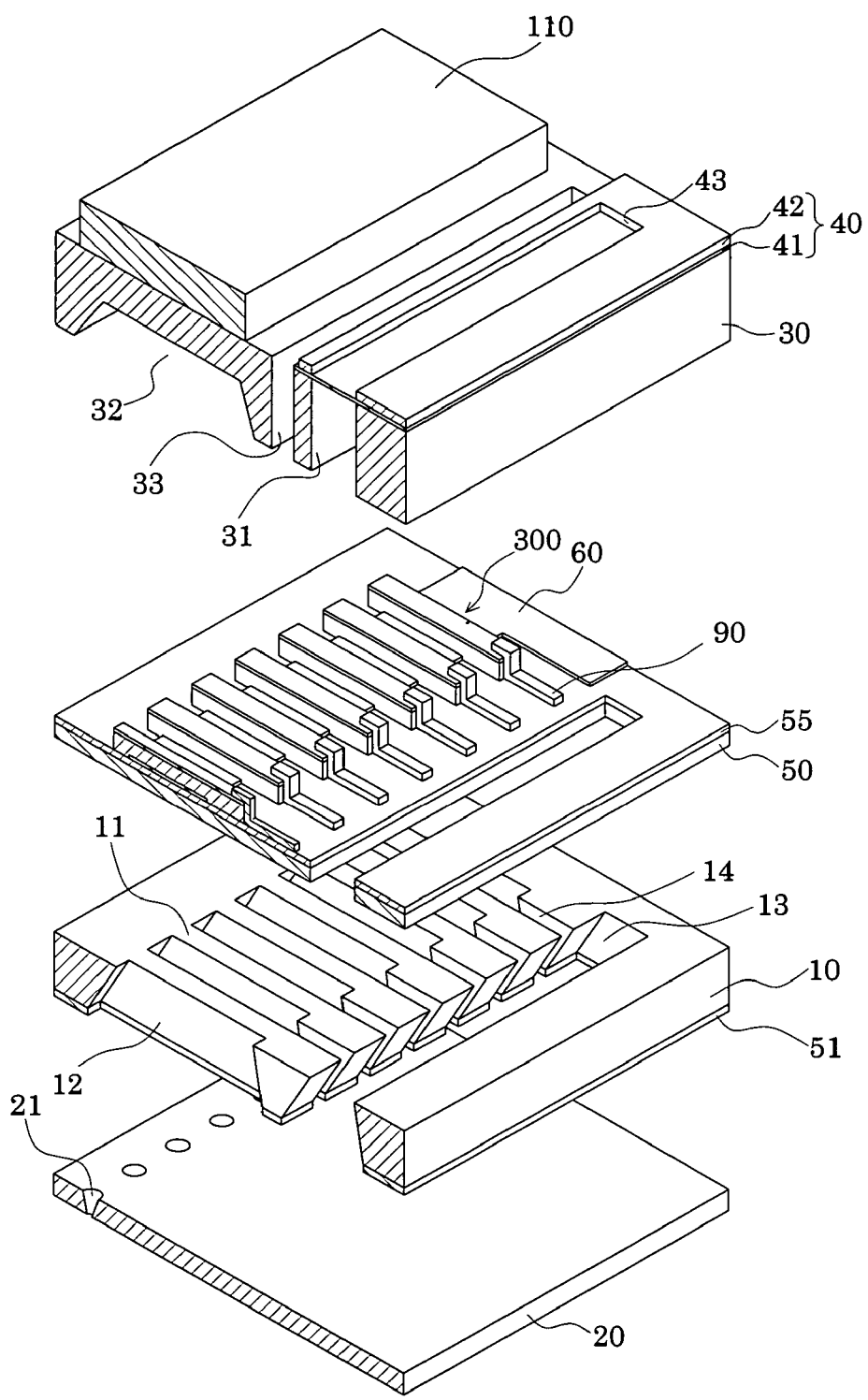
FIG. 1 is an exploded perspective view showing a schematic configuration of a recording head according to a first embodiment.
Figure 2A:
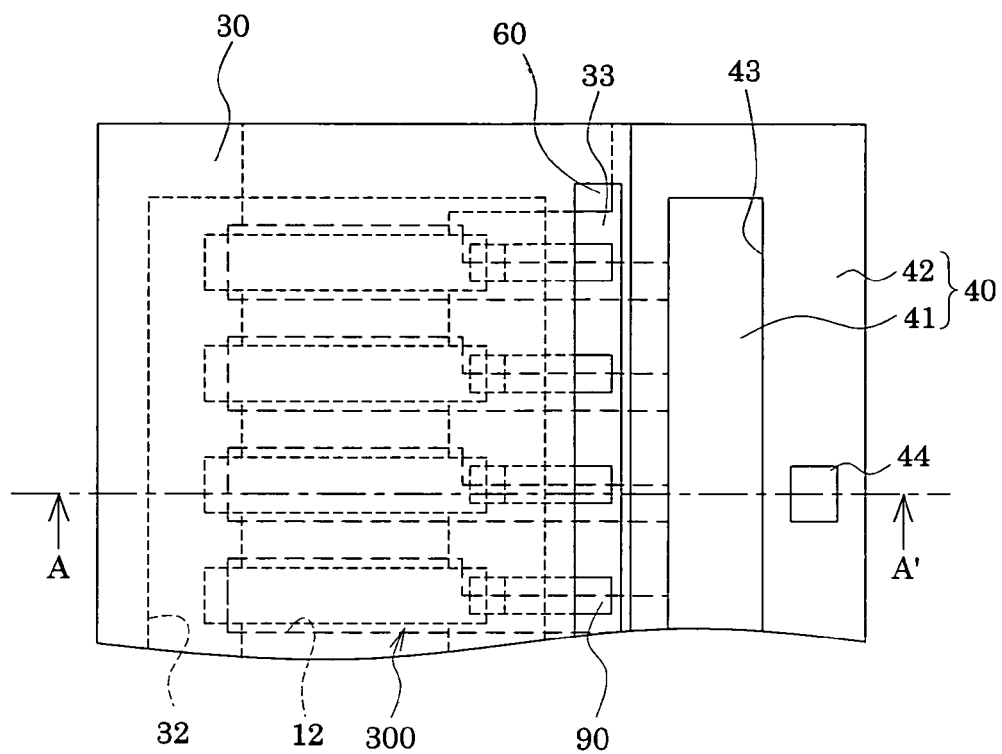
FIGS. 2A and 2B are respectively a plan and cross-sectional views of the recording head according to the first embodiment.
Figure 2B:
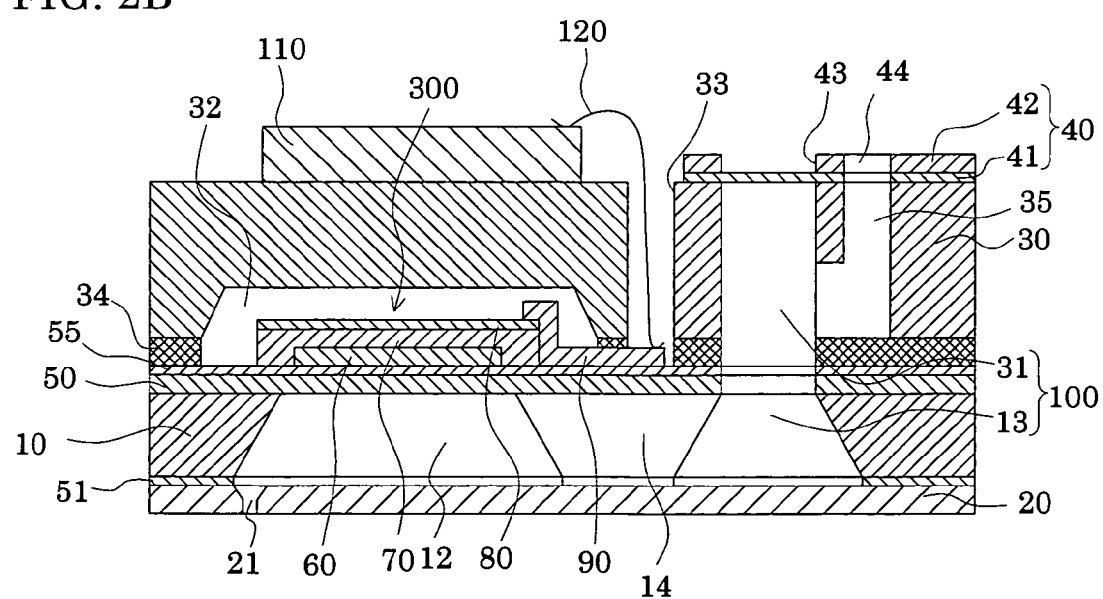

FIG. 1 is an exploded perspective view of an inkjet recording head according to a first embodiment of the present invention. FIG. 2A is a plan view of the inkjet recording head shown in FIG. 1, and FIG. 2B is a cross-sectional view of the inkjet recording head taken along the A-A' line of FIG. 2A.

In the case of this embodiment, a passage-forming substrate 10 is made of a single crystal silicon substrate, as illustrated. An elastic film 50 is formed on one of the two surfaces of the passage-forming substrate 10. The elastic film 50 has a thickness of 0.5 to 2 µm, and is made of silicon dioxide formed beforehand by thermal oxidation.

In the passage-forming substrate 10, a plurality of pressure generating chambers 12 compartmentalized by compartment walls 11 are arranged side-by-side by means of anisotropically etching the passage-forming substrate 10 from the other side. Outside the pressure generating chambers 12 in the longitudinal direction, a communicating portion 13 is formed. The communicating portion 13 constitutes a part of a reservoir 100 which is a common ink chamber for the pressure generation chambers 12. The communicating portion 13 communicates with one end of each of the pressure generating chambers 12 in the longitudinal direction through its ink supply path 14. Each of the ink supply paths 14 is formed with a width narrower than that of the pressure generating chamber 12, and thus keeps constant the passage resistance of ink flowing from the communicating portion 13 to the pressure generating chamber 12.

A nozzle plate 20 is fixed to an aperture surface of the passage-forming substrate 10 with an adhesive agent, a thermal adhesive film or the like interposed in between. In the nozzle plate 20, nozzle orifices 21 are drilled. The nozzle orifices 21 communicate respectively with the pressure-generating chambers 12 at sides of the pressure-generating chambers 12 which are opposite to the ink supply paths 14. Incidentally, the nozzle plate 20 is made of glass ceramic or stainless steel or the:like with a thickness of 0.01 to 1 mm, for example, and with a linear expansion coefficient of 2.5 to 4.5 [$\times 10^{-6}$/° C.], for example, at a temperature not higher than 300° C. One surface of the nozzle plate 20 entirely covers one surface of the passage-forming substrate 10, and thus plays a role of a reinforcement plate for protecting the single crystal silicon substrate from shock and external forces. In addition, the nozzle plate 20 may be formed of a material having a thermal expansion coefficient almost equal to that of the passage-forming substrate 10. In this case, the heat distortion of the passage-forming substrate 10 and the heat distortion of the nozzle plate 20 are almost similar to each other. For this reason, the passage-forming substrate 10 and the nozzle plate 20 can be easily joined to each other by use of a heat-hardening adhesive agent or the like.

On the other hand, as described above, the elastic film 50 is formed on the other surface of the passage-forming substrate 10 which is the side opposite to the aperture surface. The elastic film 50 has a thickness of, for example, approximately 1.0 μm, and is made of silicon dioxide. An insulation film 55 is formed on this elastic film 50 by laminating the insulation film 55 over this elastic film 50. The insulation film 55 is made of zirconia ($ZrO_2$) and the like, and its thickness is approximately 0.4 μm. Furthermore, a lower electrode film 60, piezoelectric layers 70 and upper electrode films 80 are formed on this insulation film 55 by laminating them over one another by use of the below-described process. The lower electrode film 60, one piezoelectric layer 70 and one upper electrode film 80 constitute each of piezoelectric elements 300. The lower electrode film 60 has a thickness of, for example, approximately 0.1 to 0.5 μm. Each of the piezoelectric layers 70 is made of lead zirconate titanate (PZT) or the like, and has a thickness of, for example, approximately 1.0 μm. Each of the upper electrodes 80 is made of gold, platinum, iridium or the like, and has a thickness of, for example, approximately 0.05 μm.

In this regard, the piezoelectric element 300 is a portion including the lower electrode film 60, one piezoelectric layer 70 and one upper electrode film 80. In general, the piezoelectric element 300 is configured in the following manner. One of the two electrodes of the piezoelectric element 300 is used as a common electrode. The other electrode and the piezoelectric layer 70 are patterned in each of the pressure generating chambers 12. In a portion constituted of a patterned piezoelectric layer 70 and a corresponding patterned one of the two electrodes, a piezoelectric strain occurs due to application of a voltage to the two electrodes. This portion is called a "piezoelectric active portion". In this embodiment, the lower electrode film 60 is used as a common electrode for the piezoelectric elements 300, and the upper electrode films 80 are used as individual electrodes of the piezoelectric elements 300. However, it does not matter that the use is the other way round for the conveniences of a drive circuit and interconnects. In both cases, the piezoelectric active portions are formed respectively in each of the pressure generating chambers. In addition, a combination of one piezoelectric element 300 and a vibration plate is called a "piezoelectric actuator." The vibration provides a displacement depending on a drive of the piezoelectric element 300. Incidentally, in the aforementioned example, the elastic film 50, the insulation film 55 and the lower electrode film 60 function jointly as the vibration plate.

Note that the piezoelectric layer 70 of this embodiment has an electric resistivity of at least 20 MΩ·cm. By causing the piezoelectric layer 70 to have such an electric resistivity, it is possible to prevent a leakage current from becoming larger and extend the durability life of the piezoelectric,layer 70. The leakage current of piezoelectric layer 70 of this kind is preferably not larger than $1\times10^{-8}$ A/cm². Additionally, the withstand voltage of the piezoelectric layer 70 is preferably not lower than 900 kV/cm. It is possible to extend durability life of the piezoelectric layer 70 by causing the piezoelectric layer 70 to have such leakage current and withstand voltage of the piezoelectric layer 70.

Figure 3:
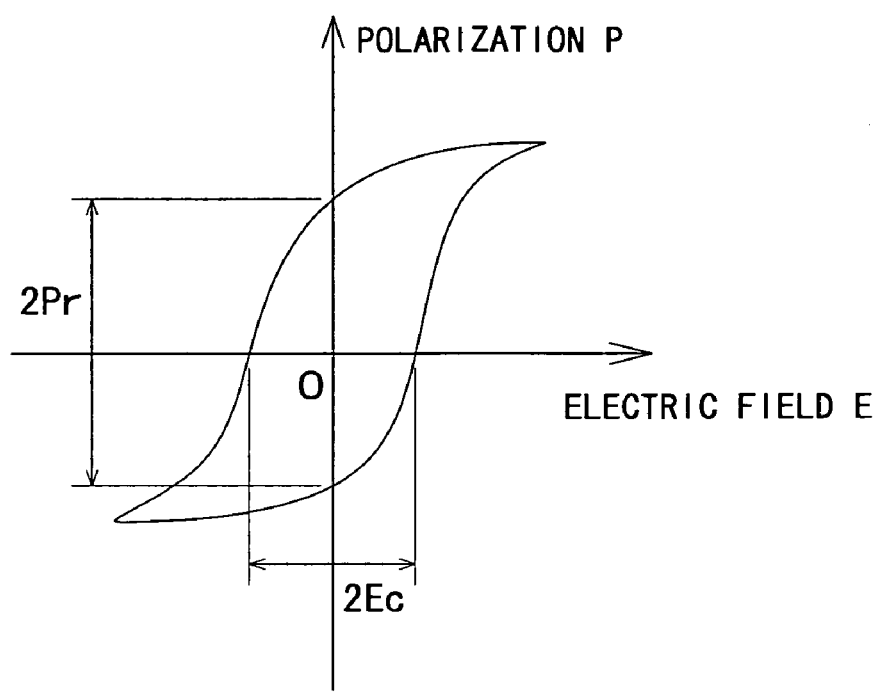
FIG. 3 is a chart showing an example of a hysteresis loop of a piezoelectric layer.

In addition, such a piezoelectric layer 70 has a relative permittivity of 750 to 1500. Further, such a piezoelectric layer 70 has characteristics that the coercive electric field is Ec=15 to 30 kV/cm (2 Ec=30 to 60 kV/cm) and the residual polarization intensity is Pr=10 to 25 μC/cm² (2 Pr=20 to 50 μC/cm²). Note that the coercive electric field Ec and the residual polarization intensity Pr are, for example, values obtained by use of the 2 Ec and the 2 Pr of the hysteresis loop of a piezoelectric layer as shown in FIG. 3.

With respect to the piezoelectric layer 70 having such characteristics, the piezoelectric constant thereof becomes especially excellent, that is, the piezoelectric constant $d_{31}$ becomes 150 to 250 PC/N. Accordingly, the displacement characteristics of the piezoelectric element 300 improve. As such a piezoelectric layer 70 of this embodiment, taken as an example is crystal films which are made of a ferroelectric-ceramics material exhibiting an electromechanical transducing effect, and which have a perovskite structure. As a material for the piezoelectric layers 70, for example, a ferroelectric-piezoelectric material and what is obtained by adding a metallic oxide to the ferroelectric-piezoelectric material and the like are desirable. Such a ferroelectric-piezoelectric material includes lead zirconate titanate (PZT). Such a metallic oxide includes niobium oxide, nickel oxide and magnesium oxide. Specifically, lead titanate ($PbTiO_3$), lead zirconate titanate (Pb (Zr, Ti) $O_3$), lead zirconate ($PbZrO_3$), lead lanthanum titanate ((Pb, La), $TiO_3$), lead lanthanum Zirconate titanate ((Pb, La) (Zr, Ti) $O_3$), lead zirconium titanate magnesium niobate (Pb (Zr, Ti) (Mg, Nb) $O_3$) or the like can be used. In this embodiment, a material containing Pb (lead), Zr (zirconium) and Ti (titanium) is used for the piezoelectric layers 70 in a manner that the formula, Pb/(Zr+Ti)=1.0 to 1.3, is obtained. Accordingly, excessive lead accumulates in the grain boundary to prevent the leakage current from becoming larger, whereby it is possible to obtain a predetermined leakage current.

In addition, at least any one dopant selected from nickel (Ni), manganese (Mn) and strontium (Sr) is doped to the piezoelectric layer 70 of this embodiment. Accordingly, it is possible to set predetermined values of electric resistivity, leakage current, withstand voltage, relative permittivity, residual polarization intensity, coercive electric field, piezoelectric constant and the like of the piezoelectric layer 70. Doping at least any one dopant selected from nickel (Ni), manganese (Mn) and strontium (Sr) is one of methods of setting the predetermined values of electric resistivity, leakage current, withstand voltage, relative permittivity, residual polarization intensity, coercive electric field, piezoelectric constant and the like of the piezoelectric layer 70. A predetermined amount of such a dopant is preferably doped. The amount of such an dopant is preferably a predetermined amount of, specifically, not more than 10 mol % thereof. That "not more than 10 mol %" is used herein is not because the more amount of the dopant is reduced, the better it is, but because the maximum amount is determined since a large amount of the dopant results in reducing the amount of displacement of the piezoelectric layer 70.

Further, the piezoelectric layers 70 are formed with a thickness which prevents cracks from occurring in the piezoelectric layers 70 in the manufacturing process, and which enables the piezoelectric layers 70 to exhibit their displacement characteristic sufficiently. In this embodiment, for example, the piezoelectric layer 70 is formed in a thickness of approximately 1 µm to 2 µm.

Additionally, a lead electrode 90 is connected to each of the upper electrode films 80 which are individual electrodes for the respective piezoelectric elements 300. The lead electrode 90 is drawn out from the vicinity of an end of the corresponding ink supply path 14, and is extended to the top of the insulation film 55. The lead electrode 90 is made of, for example, gold (Au) or the like.

A protection plate 30 is joined to the top of the passage-forming substrate 10 over which such piezoelectric elements 300 are formed, in other words, above the lower electrode film 60, the elastic film 50 and the lead electrodes 90, with an adhesive agent 34 interposed in between. The protection plate 30 includes a reservoir portion 31 constituting at least a part of a reservoir 100. In this embodiment, this reservoir portion 31 is formed in a way that the reservoir portion 31 penetrates through the protection plate 30 in the thickness direction, and that the reservoir portion 31 extends in a direction which is the same as the width direction of the pressure generating chambers 12. The reservoir portion 31 communicates with the communication portion 13 of the passage-forming substrate 10 as described above, and thus constitutes the reservoir 100 which is used as a common ink chamber for the pressure generating chambers 12.

Moreover, a piezoelectric element holding portion 32 is provided to a region of the protection plate 30, which region is opposite to the piezoelectric elements 300. The piezoelectric element holding portion 32 has a cavity large enough for the piezoelectric elements 300 to move without hindrance. It suffices if the protection plate, 30 has a cavity large enough for the piezoelectric elements 300 to move without hindrance. It does not matter whether or not the cavity is sealed closed.

It is desirable that a material having a thermal expansion coefficient equal to that of the passage-forming substrate 10 be used for such a protection plate 30. Examples of the material include glass, ceramics and the like. In this embodiment, the protection plate 30 is formed of a single crystal silicon substrate which is the same material as the passage-forming substrate 10 is formed of.

Furthermore, the protection plate 30 is provided with a through-hole 33 which penetrates through the protection plate 30 in the thickness direction. Moreover, the vicinities of the ends of the lead electrodes 90 drawn out respectively from the piezoelectric elements 300 are set up in a way that the vicinities are exposed to the through-hole 33.

As well, a drive circuit 110 is fixed to the top of the protection substrate 30. The drive circuit 110 drives the piezoelectric elements 300 arranged in the parallel lines. For example, a circuit plate, semiconductor integrated circuit (IC) and the like can be used as this drive circuit 110. Additionally, the drive circuit 110 and each of the lead electrodes 90 are electrically connected with each other through a connecting interconnect 120. The connecting interconnect 120 is made of a conductive wire such as a bonding wire.

In addition, a compliance plate 40 is joined to the top of the protection plate 30. The compliance plate 40 is configured of a sealing film 41 and a fixed plate 42. In this regard, the sealing film 41 is made of a flexible material with a lower rigidity (for example, a polyphenylen sulfide (PPS) film) with a thickness of 6 µm). One end of the reservoir portion 31 is sealed closed by this sealing film 41. Furthermore, the fixed plate 42 is formed of a hard material such as a metal (for example, stainless steel (SUS) or the like with a thickness of 30 µm). A region of this fixed plate 42, which region is opposite to the reservoir 100, is an opening portion 43 which is obtained by completely removing a portion corresponding to the region from the fixed plate 42 in the thickness direction. Accordingly, one end of the reservoir 100 is sealed closed only by the sealing film 41 which is flexible.

An ink introducing port 44 for supplying ink to the reservoir 100 is formed in a part of the compliance plate 40. The part of the compliance plate 40 is outside of this reservoir 100, and is situated in a position corresponding roughly to the center of the reservoir 100 in the longitudinal direction. Furthermore, the protection plate 30 is provided with an ink introduction path 35 through which the ink introduction port 44 and a side wall of the reservoir 100 communicate with each other.

Such an inkjet recording head according to this embodiment takes in ink from the ink introducing port 44 connected with external ink supply means, which is not illustrated, and fills the interior ranging from the reservoir 100 through the nozzle orifices 21 with ink. Thereafter, the inkjet recording head applies a voltage between the lower electrode film 60 and each of the upper electrode films 80 corresponding to the pressure generating chambers 12, in accordance with recording signals from the drive circuit. Thus, the inkjet recording head deforms the elastic film 50, the lower electrode films 60 and the piezoelectric layers 70 with flexure. This deformation raises the pressure in each of the pressure generating chambers 12, and thereby ink droplets are ejected from the nozzle orifices 21.

Figure 4A:
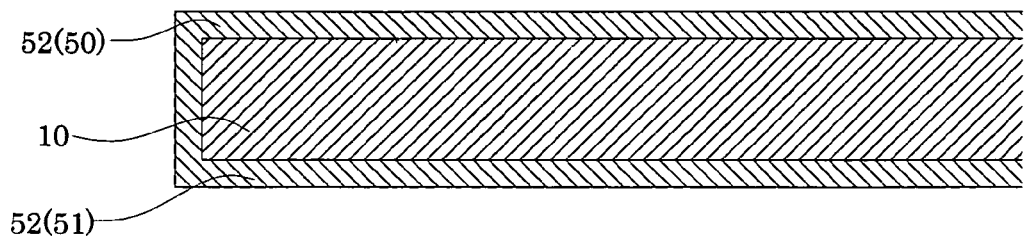
FIGS. 4A to 4C are cross-sectional views showing a method of manufacturing the recording head according to the first embodiment.
Figure 4B:
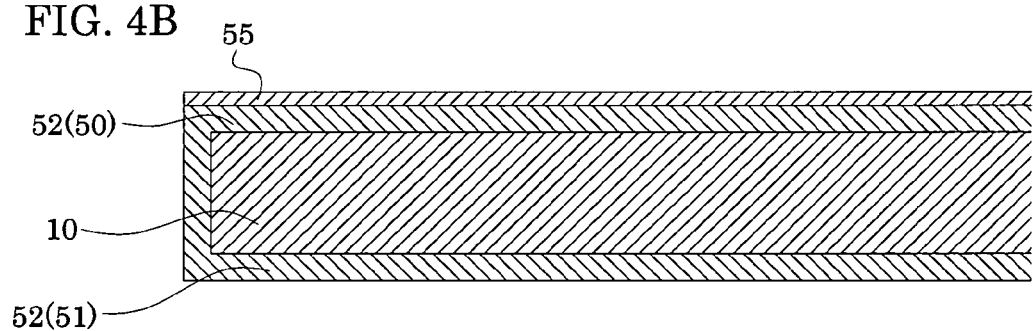

Hereinafter, descriptions will be provided for a method of manufacturing such an inkjet recording head with reference to FIGS. 4A to 6D. Note that FIGS. 4A to 6D are cross-sectional views of the pressure generating chamber 12 in the longitudinal direction. First of all, as shown in FIG. 4A, the passage-forming substrate 10 made of a single crystal silicon substrate is thermally oxidized in a diffusion furnace at approximately 1100° C. Thereby, a silicon dioxide film 52, which will be later turned into the elastic film 50 and a protection film 51, is formed on the surface of the passage-forming substrate 10. Subsequently, as shown in FIG. 4B, a zirconium (Zr) layer is formed on the elastic film 50 (the silicon dioxide film 52). Thereafter, the insulation layer 55 made of zirconia ($ZrO_2$) is formed by means of thermally oxidizing the zirconium (Zr) layer, for example, in the diffusion furnace at 500 to 1200° C.

Figure 4C:
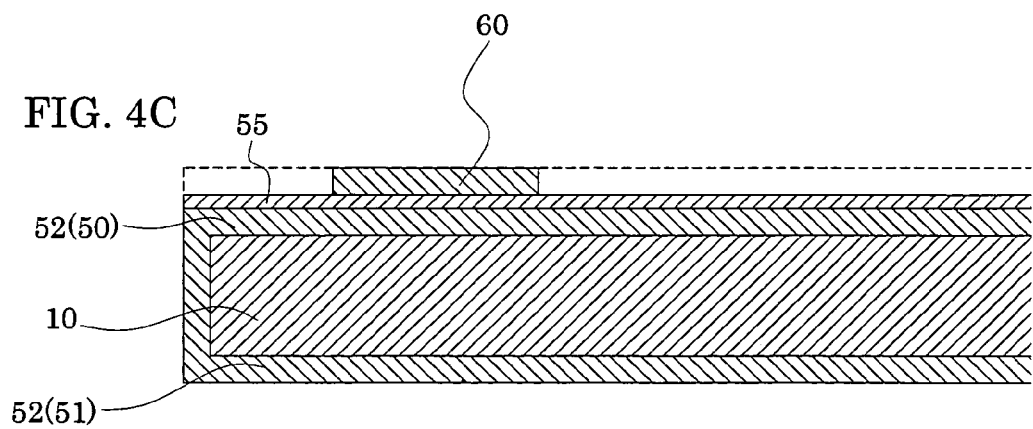

Next, as shown in FIG. 4C, the iridium, platinum, or the like is entirely formed on the top of the passage-forming substrate 10. Thereafter, the lower electrode 60 is formed by means of patterning it into a predetermined shape.

Subsequently, the piezoelectric layer 70 is formed on the lower electrode 60. In this regard, the piezoelectric layer 70 is formed by use of what is termed as a sol-gel method in this embodiment. According to the sol-gel method, what is termed as sol is obtained by dissolving and dispersing a metal-organic substance in a catalytic. This sol is applied and dried to be turned into gel. Then, the gel is baked at a higher temperature. Thereby, the piezoelectric layer 70 made of a metal-oxide substance is obtained. In addition, the method of manufacturing the piezoelectric layer 70 is not limited to the sol-gel method. For example, the MOD (Metal-Organic Decomposition) method or the like may be used.

A material for the piezoelectric layer 70 is one containing Pb, Zr, and Ti. In this embodiment, the piezoelectric layer 70 is formed of lead zirconate titanate (PZT). Additionally, the piezoelectric layer 70 of this embodiment is formed based on the formula, Pb/(Zr+Ti)=1.0 to 1.3. In other words, the piezoelectric layer 70 contains not more than 30% excessive lead. By causing the piezoelectric layer 70 to contain not more than 30% excessive lead, it is prevented that the leakage current of the piezoelectric layer 70 becomes larger. Furthermore, at least any one dopant selected from manganese (Mn), nickel (Ni) and strontium (Sr) is doped to the piezoelectric layer 70. Accordingly, the piezoelectric layer 70 with an excellent electric resistivity and a withstand voltage can be formed. Note that an excessive amount of dopant decreases the amount of displacement of the piezoelectric layer 70. For this reason, it is preferable that the amount of the dopant be equivalent to not more than 10 mol % of the whole piezoelectric layer 70. In this respect, such a dopant of manganese, nickel, strontium or the like can be doped by mixing manganese nitrate, nickel nitrate or strontium nitrate into sol. In addition, although as is described in detail later, the doped dopant also exists in the piezoelectric layer 70 formed by means of the baking.

Figure 5A:
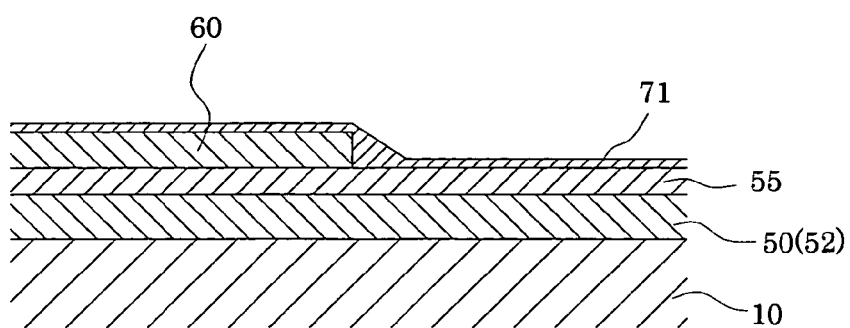
FIGS. 5A to 5C are cross-sectional views showing the method of manufacturing the recording head according to the first embodiment.

A specific procedure of forming the piezoelectric layer 70 is as follows. As shown in FIG. 5A, first of all, a piezoelectric precursor film 71 which is a PZT precursor is formed on the lower electrode film 60. In other words, the sol (liquid solution) containing the metal-organic compound is applied to the top of the lower electrode film 60 which has been formed above the passage-forming substrate 10 (in the applying step).

Subsequently, this piezoelectric precursor film 71 is heated at a predetermined temperature, and thus is dried for a certain time. In this embodiment, the piezoelectric precursor film 71 can be dried, for example, by means of keeping the piezoelectric precursor film 71 at 170 to 180° C. for 8 to 30 minutes. Furthermore, it is desirable that the rate of temperature rise in the drying step be 0.5 to 1.5° C./sec. Incidentally, the "rate of temperature rise," which has been referred to in this respect, is defined as a rate of change of temperature from Temperature 1 through Temperature 2 with respect to time. Temperatures 1 and 2 are calculated in the following manner. To begin with, the difference between a temperature (room temperature), at which the heating is started, and a temperature which the piezoelectric precursor film 71 reaches by the heating is obtained. Then, Temperature 1 is obtained by adding 20% of the difference to the temperature at which the heating is started. Temperature 2 is obtained by adding 80% of the difference to the temperature at which the heating is started. In a case where, for example, the temperature is raised from a room temperature (25° C.) to 100° C. in 50 seconds, the rate of temperature rise is as follows.

$$(100-25) \times (0.8-0.2)/50 = 0.9 \ [°C./sec]$$

Subsequently, the piezoelectric precursor film 71, which has been dried, is degreased by means of heating the piezoelectric precursor film 71 up to a predetermined temperature and keeping the film at that temperature for a certain time. In the case of this embodiment, the piezoelectric precursor film 71 is degreased, for example, by means of heating the film up to a temperature of approximately 300° C. to 400° C. and keeping the film at the temperature for approximately 10 to 30 minutes. Incidentally, the degreasing, which has been referred to in this respect, means that organic components contained in the piezoelectric precursor film 71 are eliminated therefrom, for example, as $NO_2$, $CO_2$, $H_2O$ and the like. In the degreasing step, it is desirable that the rate of temperature rise be 0.5 to 1.5° C./sec.

Then, the piezoelectric precursor film 71 is heated up to a predetermined temperature, and is kept at the temperature for a certain time, and thus is crystallized. Accordingly, a piezoelectric film 72 is formed (in the baking step). In the baking step, it is desirable that the piezoelectric precursor film 71 be heated up to a temperature of 650° C. to 750° C. In this embodiment, the piezoelectric precursor film 71 is heated at 680° C. for 30 minutes. Moreover, in the baking step, it is desirable that the rate of temperature rise is not more than 15° C./sec. As described, in the case of forming the piezoelectric film 72 by means of the baking, it is preferable that the piezoelectric precursor film 71 be heated at least for 30 minutes. Accordingly, the piezoelectric film 72 having excellent characteristics can be obtained.

Note that, for example, an RTP (rapid thermal processing) system can be used as the heating system used for the drying, degreasing and baking steps. The RTP system performs the thermal process by means of irradiation from a hot plate or an infrared lamp.

Then, the piezoelectric-layer forming step including the aforementioned applying, drying, degreasing and baking steps is repeated a plurality of times. In the case of this embodiment, the piezoelectric-layer forming step is repeated ten times. Thus, the piezoelectric layer 70 with a predetermined thickness, including ten piezoelectric films 72, is formed as shown in FIG. 5C. In a case where the thickness of the sol which is applied each time is approximately 0.1 μm, the total film thickness of the piezoelectric layer 70 is approximately 1.1 μm.

Note that, in a real process, the first and second piezoelectric films 72 are formed by means of baking the piezoelectric precursor films 71 respectively. The third and subsequent films are formed in the following manner. First, the applying, drying, and degreasing steps are performed for each of the piezoelectric precursor films 71 twice. Subsequently, in the baking step, two of the piezoelectric precursor films 71 are baked at a time. In other words, the piezoelectric layer 70 consisting of ten piezoelectric thin films 72 can be formed by performing the baking for six times. In this respect, it is preferable that the total baking period for such a piezoelectric layer 70 is for not more than three hours. This makes it possible to form the piezoelectric layer 70 having excellent characteristics.

In this regard, the withstand voltage, relative permittivity and electric resistivity of the piezoelectric layer 70 were measured in cases where the changed amount of the dopant was doped thereto. The results of the measurement are shown below in Table 1.

TABLE 1

| Dopant | Amount of dopant mol % | Withstand voltage kV/cm | Relative permittivity | Electric resistivity MΩ · cm |
|---|---|---|---|---|
| No dopant | 0 | 756 | 1248 | 21.3 |
| Mn | 1 | 1074 | 959 | 80 |

TABLE 1-continued

| Dopant | Amount of dopant mol % | Withstand voltage kV/cm | Relative permittivity | Electric resistivity MΩ · cm |
|---|---|---|---|---|
| Mn | 2 | 1452 | 909 | 95.6 |
| Ni | 1 | 1444 | 1159 | 33.8 |
| Ni | 2 | 2500 | 1047 | 50.3 |
| Sr | 5 | 1020 | 1519 | 32.3 |
| Sr + Mn | 5 + 2 | not less than 2500 | 1226 | 74.5 |
| Sr + Mn | 5 + 2 | not less than 2500 | 1049 | 51.9 |

As shown in Table 1, since the piezoelectric layer 70 is formed by means of doping a dopant thereto, the piezoelectric layer 70 can be formed to have an electric resistivity of not lower than 20 MΩ·cm and a withstand voltage of 900 kV/cm. Accordingly, the durability life of the piezoelectric layer 70 can be extended. Incidentally, even though an dopant is doped, the relative permittivity of the piezoelectric layer 70 can be 750 to 1500 and the crystallinity thereof can be significantly improved. Accordingly, the durability life of the piezoelectric layer 70 can be extended.

Further, the piezoelectric layer 70 can be formed to have a leakage current of not larger than $1 \times 10^{-8}$ A/cm$^2$ by the method of manufacturing the piezoelectric layer 70 according to the embodiment. It is possible to extend the durability life of the piezoelectric layer 70 by setting the leakage current as described.

Additionally, in a case where the piezoelectric layer 70 is formed under the conditions of this embodiment, the coercive electric field Ec of the piezoelectric layer 70 is 15 to 30 kV/cm and the residual polarization intensity Pr is approximately 10 to 25 μC/cm$^2$.

Figure 5B:
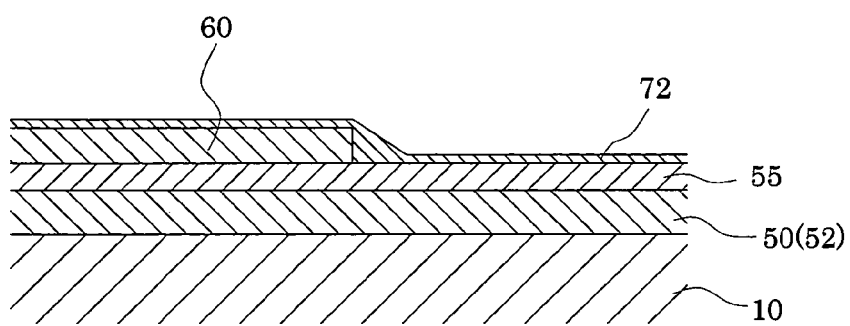
Figure 5C:
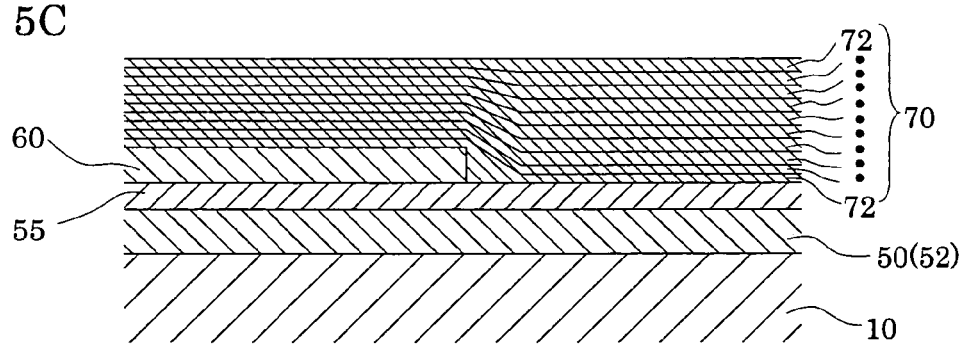
Figure 6A:
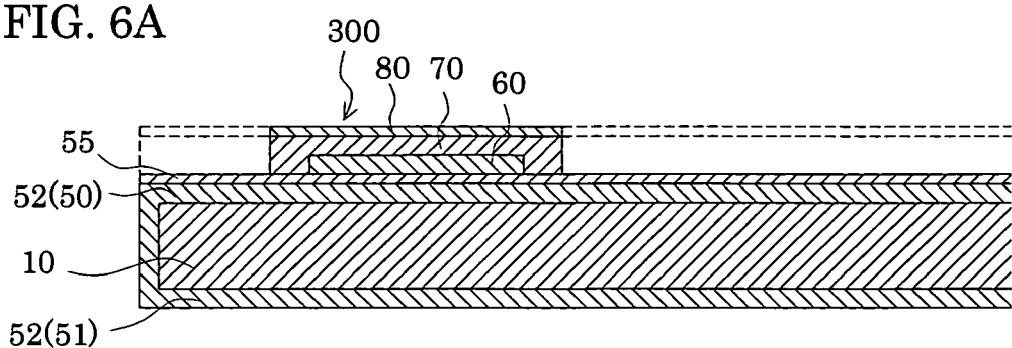
FIGS. 6A to 6D are cross-sectional views showing the method of manufacturing the recording head according to the first embodiment.

In addition, after the piezoelectric layer 70 is formed through the steps as shown in FIGS. 5A to 5C, the upper electrode film 80 is formed above the entire surface of the passage-forming substrate 10, as shown in FIG. 6A. The upper electrode film 80 is made of, for example iridium. Then, the piezoelectric layer 70 and the upper electrode film 80 are patterned in each of the regions respectively opposite to the pressure generating chambers 12. Thus, the piezoelectric elements 300 are formed.

The piezoelectric layer 70 formed in this manner has the piezoelectric constant $d_{31}$ as high as 150 to 250 (pC/N), whereby the displacement characteristics of the piezoelectric element 300 is significantly improved. Thus, a characteristic of ejecting ink can be improved.

Figure 6B:
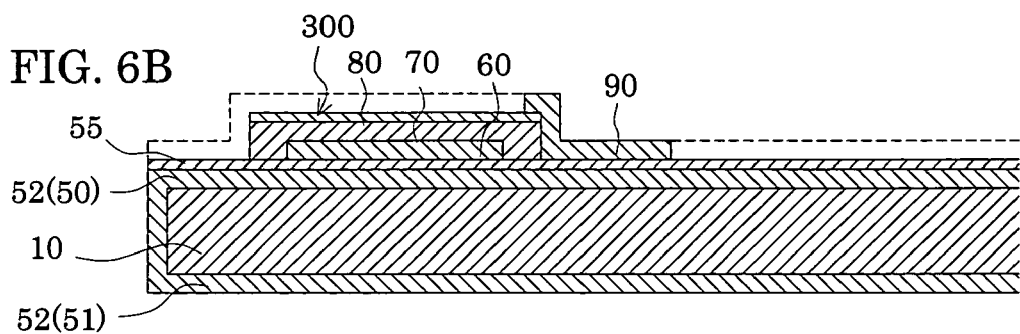

Subsequently, the lead electrodes 90 are formed. Specifically, the lead electrodes 90 are formed in the following manner. First, a lead electrode 90 is formed above the entire surface of the passage-forming substrate 10 as shown in FIG. 6B. The lead electrode 90 is made, for example, of gold (Au) and the like. Thereafter, the lead electrode 90 is patterned in each of the piezoelectric elements 300 by use of a mask pattern (not illustrated) made, for example, of a resist or the like.

Figure 6C:
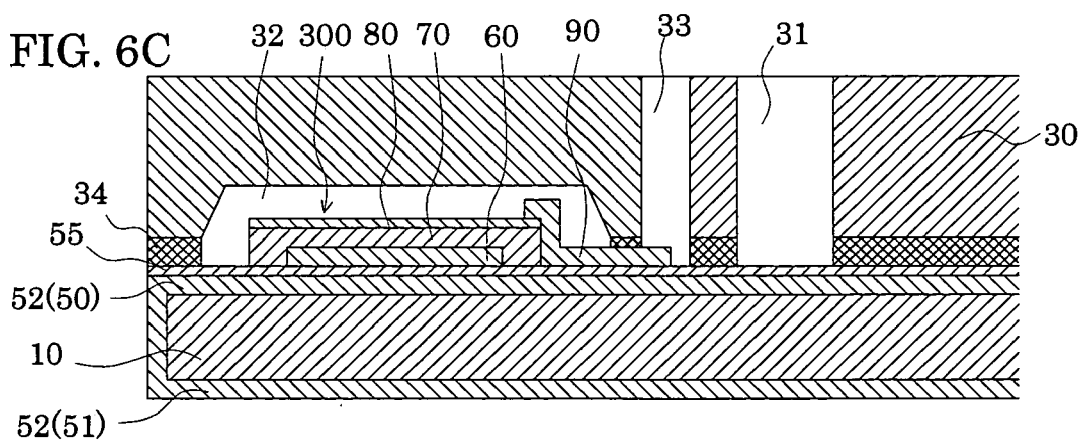

Next, the protection plate 30 is joined to the top of the passage-forming substrate 10, for example, with the adhesive agent 34, as shown in FIG. 6C. The protection plate 30 holds the plurality of piezoelectric elements 300 thus patterned. Incidentally, the reservoir portion 31, the piezoelectric element holding portion 32 and the like are formed beforehand in the protection plate 30. In addition, the protection plate 30 is made, for example, of a single crystal silicon substrate having a thickness of approximately 400 μm. The joining of the protection plate 30 to the passage-forming substrate 10 remarkably increases the rigidity of the resultant passage-forming substrate 10.

Figure 6D:
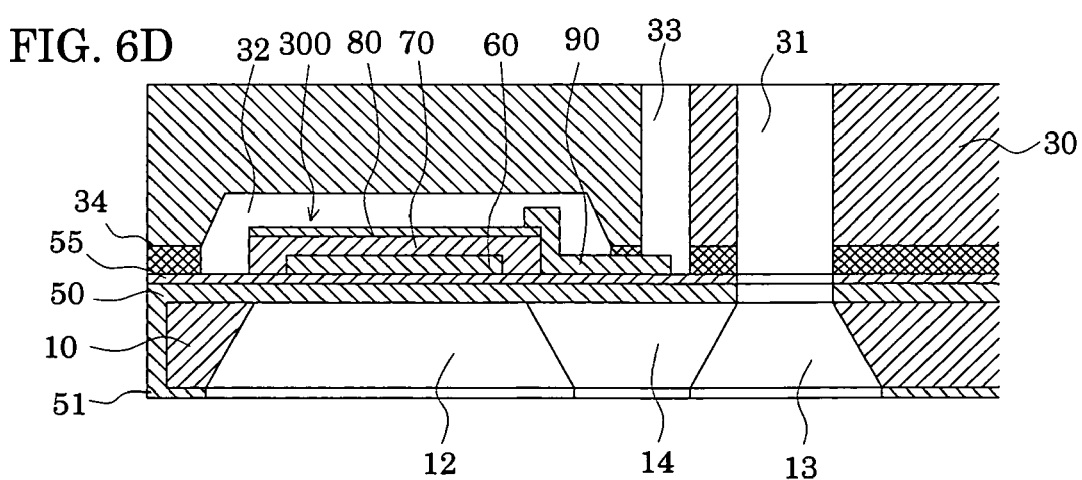

Subsequently, as shown in FIG. 6D, the protection film 51 is formed by means of patterning the silicon dioxide film 52 on a surface of the passage-forming substrate 10, into a predetermined shape, the surface being opposite to the surface above which the piezoelectric elements 300 are formed. With the protection film 51 used as a mask, the passage-forming substrate 10 is caused to undergo an anisotropic etching (wet-etching) by use of an alkaline solution such as KOH. Thereby, the pressure-forming chambers 12, the communicating portion 13, the ink supply paths 14 and the like are formed in the passage-forming substrate 10.

Subsequently, the nozzle plate 20 is joined to a surface of the passage-forming substrate 10, which surface is opposite to the surface to which the protection plate 30 has been joined. The nozzle orifices 21 are drilled in the nozzle plate 20. Concurrently, the compliance plate 40 is joined to the protection plate 30. Thereby, the inkjet recording head as shown in FIG. 1 is formed.

Note that a large number of chips are actually formed on a single wafer at a time through the aforementioned series of film formations and anisotropic etchings. After the process is completed, the wafer is divided into passage-forming substrates 10 each in a chip size as shown in FIG. 1. Thus, the inkjet recording heads are formed.

According to the present invention, as described above, each of the piezoelectric layers 70 constituting the piezoelectric element 300 is formed with an electric resistivity of not lower than 20 MΩ·cm. This increases the piezoelectric constant $d_{31}$ of the piezoelectric layer 70. Accordingly, the displacement characteristics of the piezoelectric element 300 improve. Furthermore, crystallinity of the piezoelectric layer 70 improves. For this reason, for example, the withstand voltage of the piezoelectric layer 70 can be not lower than 900 kV/cm while the leakage current thereof can be not larger than $1 \times 10^{-8}$ A/cm$^2$. Thereby, the durability life of the piezoelectric layer 70 can be significantly extended.

Figure 7:
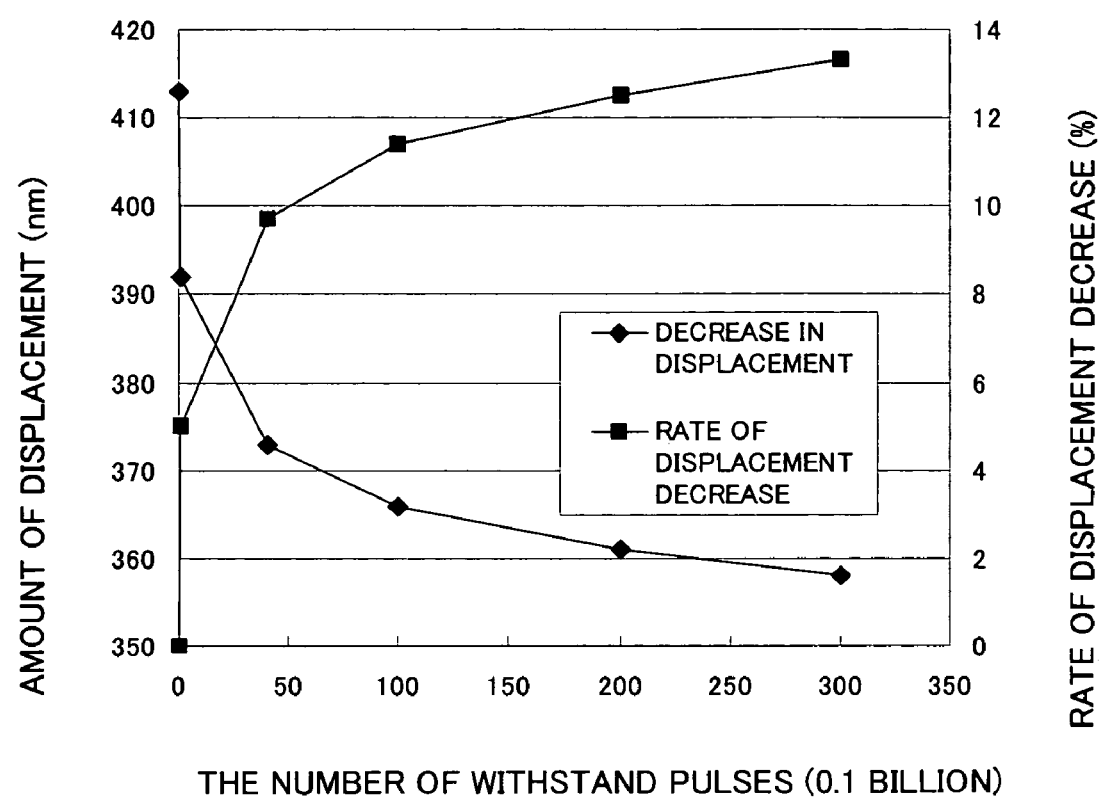
FIG. 7 is a graph showing an amount of displacement and a rate of displacement decrease of a sample piezoelectric element.

In this respect, a sample of piezoelectric element having the characteristics described above was caused to undergo a durability test in which a predetermined drive pulse is continuously applied to the sample thirty billion times. FIG. 7 shows the result of examining the amount of displacement of the piezoelectric element and a decrease in the displacement. Incidentally, with respect to the sample piezoelectric element, a piezoelectric layer had a thickness of 1.5 μm, a lower electrode film had a thickness of 200 nm, and an upper electrode film had a thickness of 50 nm. The drive pulse applied in the durability test was a sin wave with a voltage of 50V and a frequency of 100 kHz. A drive pulse applied during displacement measurement was a trapezoidal wave with a voltage of 30V and a frequency of 800 Hz.

As shown in FIG. 7, with respect to the piezoelectric element according to the present invention, the amount of displacement thereof was decreased along with the increase in the number of the withstand pulses, that is, the rate of displacement decrease was increased. However, even after the drive pulse is applied thirty billion times, the rate of displacement decrease was as significantly low as 13.3%. As clear from the result, the durability life of the piezoelectric element (piezoelectric layer) is significantly improved according to the present invention.

Other Embodiments

The first embodiment of the present invention has been described above. However, a basic configuration of an inkjet recording head is not limited to the aforementioned one. In the above-described first embodiment, for example, the piezoelectric layer is formed by use of the sol-gel method or the MOD method. However, it is not particularly limited to this. For example, the piezoelectric layer may be formed by means of a sputtering method. In a case of forming the piezoelectric film by means of the sputtering method as described, it suffices that post annealing is performed on the piezoelectric precursor film for half an hour to three hours at 650 to 750° C.

Further, in the above-described first embodiment, at least any one dopant selected from nickel (Ni), manganese (Mn) and strontium (Sr) was doped to each of the piezoelectric layers 70 constituting the piezoelectric element 300. However, it is not particularly limited to this. The piezoelectric layer 70 having desired characteristics can be obtained even if no nickel (Ni), manganese (Mn), strontium (Sr) or the like is doped thereto.

Figure 8:
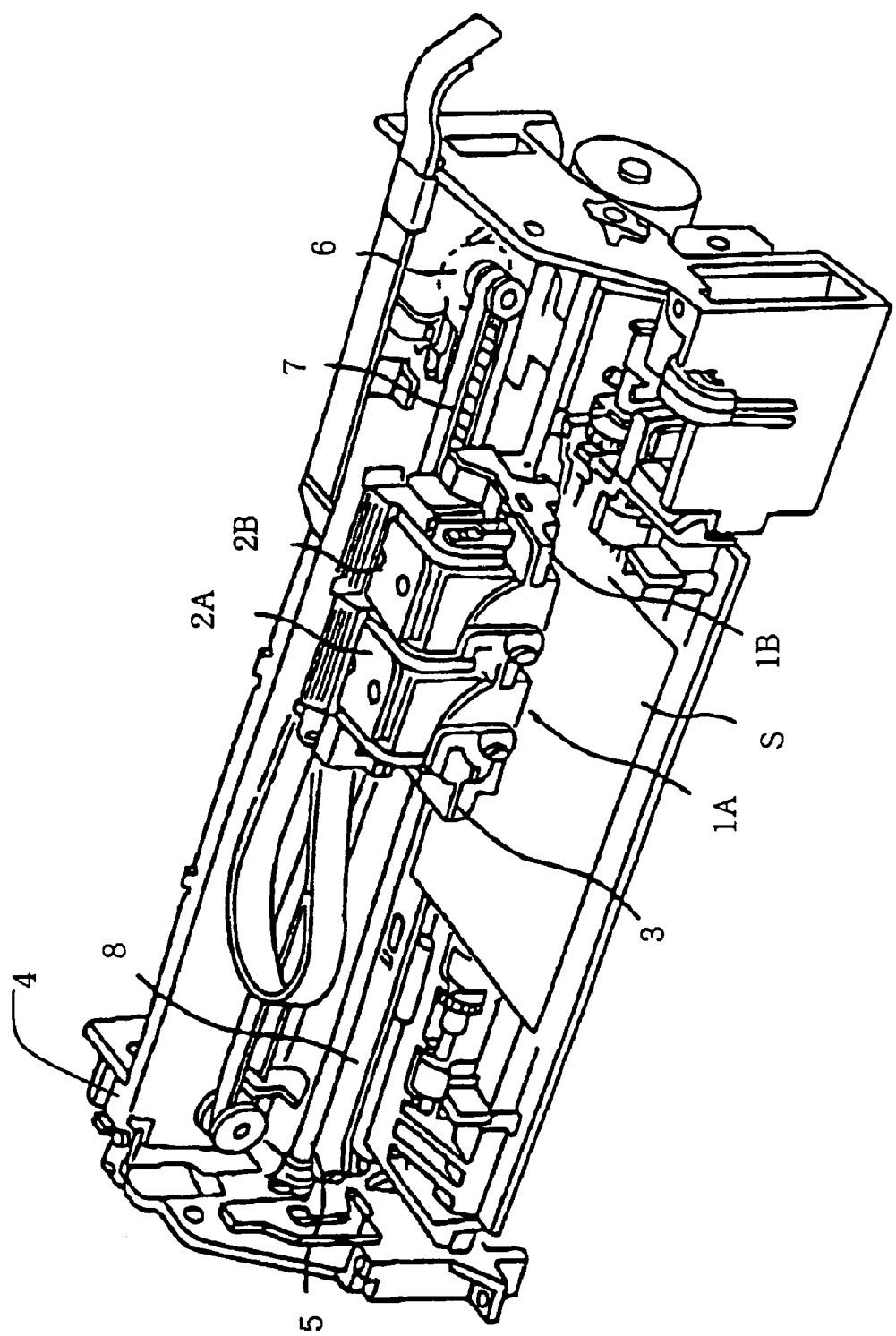
FIG. 8 is a diagram showing a schematic configuration of a recording device according to an embodiment.

In addition, the inkjet recording head according to each of those embodiments constitutes a part of a recording head unit provided with an ink passage communicating with an ink cartridge and the like, and is installed in an inkjet recording device. FIG. 8 is a schematic configuration diagram showing an example of the inkjet recording device.

As shown in FIG. 8, recording head units 1A and 1B including the respective inkjet recording heads are detachably provided to cartridges 2A and 2B constituting ink supply means. A carriage 3 on which the recording head units 1A and 1B are mounted is provided to a carriage shaft 5 fixed to the device main body 4 in a way that the carriage 3 can be freely moved in the direction in which the shaft extends. These recording head units 1A and 1B are assigned to ejecting black ink compositions and color ink compositions respectively.

In addition, a drive power from a drive motor 6 is transmitted to the carriage 3 though a plurality of gears, which are not illustrated, and a timing belt 7. Thereby, the carriage 3 on which the recording head units 1A and 1B are mounted is caused to move along the carriage shaft 5. On the other hand, the device main body 4 is provided with a platen 8 along the carriage shaft 5. A recording sheet S, which is a recording medium such as a sheet of paper, and which has been fed by feed rollers and the like, is designed to be transferred on the platen 8, the feed rollers being not illustrated.

Note that the present invention is intended to be widely applied to the entire range of liquid-jet heads, although the first embodiment has been described above giving the inkjet recording head as an example of the liquid-jet heads. It goes without saying that the present invention can be applied to any liquid-jet head which ejects a liquid other than ink. Examples of liquid-jet head which eject a liquid other than ink includes various recording heads used for image recording devices such as printers; color-material-jet heads used for manufacturing color filters of liquid crystal display devices and the like; electrode-material-jet heads used for forming electrodes of organic EL display devices, FED (Field Emission Display) devices and the like; bio-organic-substance-jet heads used for manufacturing bio-chips; and the like.

What is claimed is:

1. A piezoelectric element comprising:
   a lower electrode provided above a substrate;
   a piezoelectric layer provided above the lower electrode; and
   an upper electrode provided above the piezoelectric layer,
   wherein the piezoelectric layer contains at least any one dopant selected from the group consisting of manganese, nickel and strontium, and
   wherein electric resistivity of the piezoelectric layer is not lower than 20 MΩ·cm;
   wherein a leakage current of the piezoelectric layer is not larger than $1 \times 10^{-8}$ A/cm$^2$; and
   wherein a coercive electric field and residual polarization intensity of the piezoelectric layer are respectively 15 to 30 kV/cm an 10 to 25μC/cm$^2$.

2. The piezoelectric element according to claim 1, wherein a withstand voltage of the piezoelectric layer is not lower than 900 kV/cm.

3. The piezoelectric element according to claim 1, wherein a relative permittivity of the piezoelectric layer is 750 to 1500.

4. A liquid-jet head comprising:
   the piezoelectric element according to claim 1; and
   a passage-forming substrate, to which the piezoelectric element is provided with a vibration plate interposed in between, and to which a pressure generating chamber communicating with a nozzle orifice is provided.

5. A liquid-jet head comprising:
   the piezoelectric element according to claim 2; and
   a passage-forming substrate, to which the piezoelectric element is provided with a vibration plate interposed in between, and to which a pressure generating chamber communicating with a nozzle orifice is provided.

6. A liquid-jet head comprising:
   the piezoelectric element according to claim 3; and
   a passage-forming substrate, to which the piezoelectric element is provided with a vibration plate interposed in between, and to which a pressure generating chamber communicating with a nozzle orifice is provided.

7. A liquid-jet apparatus comprising the liquid-jet head according to claim 4.

* * * * *